(12) United States Patent
Suleski et al.

(10) Patent No.: US 9,238,577 B2
(45) Date of Patent: Jan. 19, 2016

(54) DYNAMIC LASER BEAM SHAPING METHODS AND SYSTEMS

(71) Applicants: Thomas J. Suleski, Charlotte, NC (US); Paul J. Smilie, Charlotte, NC (US); Jason A. Shultz, Charlotte, NC (US)

(72) Inventors: Thomas J. Suleski, Charlotte, NC (US); Paul J. Smilie, Charlotte, NC (US); Jason A. Shultz, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 14/141,919

(22) Filed: Dec. 27, 2013

(65) Prior Publication Data

US 2015/0009583 A1    Jan. 8, 2015

Related U.S. Application Data

(63) Continuation-in-part of application No. 13/935,851, filed on Jul. 5, 2013, now abandoned.

(60) Provisional application No. 61/703,835, filed on Sep. 21, 2012.

(51) Int. Cl.
*G02B 3/02* (2006.01)
*B81B 5/00* (2006.01)
*G02B 27/09* (2006.01)

(52) U.S. Cl.
CPC ............. *B81B 5/00* (2013.01); *G02B 27/095* (2013.01); *G02B 27/0927* (2013.01); *G02B 27/0933* (2013.01)

(58) Field of Classification Search
CPC .................................................. G02B 13/003
USPC ................................................. 359/717, 793
See application file for complete search history.

(56) References Cited

U.S. PATENT DOCUMENTS 2,001,952 A    5/1935    Birchall
3,305,294 A    2/1967    Alvarez
(Continued)

FOREIGN PATENT DOCUMENTS

GB             250268         7/1926

OTHER PUBLICATIONS

John A. Hoffnagle and C. Michael Jefferson, Design and performance of a refractive optical system that converts a Gaussian to a flattop beam, Applied Optics y vol. 39, No. 30 y Oct. 20, 2000.
(Continued)

*Primary Examiner* — James Jones
(74) *Attorney, Agent, or Firm* — Clements Bernard PLLC; Christopher L. Bernard; Lawrence A. Baratta, Jr.

(57) ABSTRACT

Dynamic radiation beam shaping methods and systems, comprising: providing a radiation source for delivering an input radiation beam; disposing a first optical element substantially adjacent to the radiation source; disposing a second optical element substantially adjacent to the first optical element; and moving one or more of the first optical element and the second optical element relative to one another such that either an output radiation beam has a variable predetermined shape or the output radiation beam maintains a predetermined shape when the input radiation beam is varied. Optionally, the first optical element and the second optical element each comprise a freeform shape and predetermined diffractive characteristics, refractive characteristics, reflective characteristics, hybrid characteristics, gradient index materials, metamaterials, metasurfaces, subwavelength structures, and/or plasmonics. The one or more of the first optical element and the second optical element are one or more of translated laterally with respect to an optic axis, rotated about the optic axis, tilted with respect to the optic axis, and separated along the optic axis.

10 Claims, 14 Drawing Sheets

(56) References Cited

U.S. PATENT DOCUMENTS

| | | | |
|---|---|---|---|
| 3,476,463 | A | 11/1969 | Kreuzer |
| 3,507,565 | A | 4/1970 | Alvarez et al. |
| 6,295,168 | B1 | 9/2001 | Hoffnagle |
| 6,654,183 | B2 | 11/2003 | Coufal et al. |
| 6,801,368 | B2 | 10/2004 | Coufal et al. |
| 6,943,964 | B1 | 9/2005 | Zhang |
| 7,400,457 | B1 | 7/2008 | Cayer |
| 2009/0086325 | A1* | 4/2009 | Liu .................... H01L 51/5237 359/599 |
| 2013/0114060 | A1* | 5/2013 | Patra .................. G03F 7/70091 355/71 |
| 2013/0155648 | A1* | 6/2013 | Morgenbrod et al. .......... 362/84 |

OTHER PUBLICATIONS

Laskin, Beam shaping? Easy! Industrial Laser Solutions, Jul. 2006.

Alexander Laskin, Vadim Laskin, Variable beam shaping with using the same field mapping refractive beam shaper, Laser Resonators, Microresonators, and Beam Control XIV, edited by Alexis V. Kudryashov, Alan H. Paxton, Vladimir S. Ilchenko, Lutz Aschke, Kunihiko Washio, Proc. of SPIE vol. 8236, 82360D • © 2012 SPIE • CCC code: 0277-786X/12/$18 • doi: 10.1117/12.903606.

Ding et al., "Freeform LED lens for uniform illumination," Optics Express, vol. 16, No. 17, pp. 12958-12966.

Laskin et al., "Variable beam shaping with using the same field mapping refractive beam shaper," Proc. of SPIE vol. 8236, 82360D, pp. 82360D1-10.

Shealy et al., "Optical design of laser beam shaping systems," Proc. SPIE 4832, 2002.

Hoffnagle et al., "Design and performance of a reflective optical system that converts a Gaussian to a flattop beam," Applied Optics, vol. 39, No. 30, Oct. 2000, pp. 5488-5499.

Laskin, Alexander, "Beam Shaping? Easy!" Laser Industrial Solutions, Jul. 2006, pp. 17-19.

Rubinstein et al., "Intensity control with a free-form lens," J. Opt. Soc. Am. A, vol. 24, No. 2, Feb. 2007, pp. 463-469.

* cited by examiner

+

=

Output for d = -0.3 mm (2x2 mm)

Output for d = 0 mm (4x4 mm)

Output for d = 0.3 mm (6x6 mm)

DYNAMIC LASER BEAM SHAPING METHODS AND SYSTEMS

CROSS-REFERENCE TO RELATED APPLICATION(S)

The present patent application/patent is a continuation-in-part (CIP) of co-pending U.S. patent application Ser. No. 13/935,851, filed on Jul. 5, 2013, and entitled "VARIABLE BEAM SHAPING METHODS AND APPARATUS THERETO," which claims the benefit of priority of U.S. Provisional Patent Application No. 61/703,835, filed on Sep. 21, 2012, and entitled "VARIABLE BEAM SHAPING METHODS AND APPARATUS THERETO," the contents of both of which are incorporated in full by reference herein.

FIELD OF THE INVENTION

The present invention relates generally to the optics field. More specifically, the present invention relates to dynamic laser beam shaping methods and systems.

BACKGROUND OF THE INVENTION

In the past, a variety of optical systems have been designed that have the capability of dynamically varying some of their optical functions—notably including the Alvarez lens. An Alvarez lens is a lens that includes two complimentary cubic surfaces separated by a negligible gap. When these cubic surfaces are translated laterally with respect to one another, either a convex or a converging spherical lens is created and the focal length of the lens changes. This system is illustrated in FIG. 1. Others have designed similar systems.

To date, what has not been provided is an optical system that is capable of dynamically shaping a laser beam using multiple relatively moving optical components. The dynamic laser beam shaping methods and systems of the present invention are based upon the premise that light transmitted through multiple optical surfaces in close proximity experiences wavefront modification from the combination of surfaces, and that controlled relative movement between these surfaces enables dynamic changes in the resulting optical functions, including beam shape.

BRIEF SUMMARY OF THE INVENTION

In various exemplary embodiments, the present invention provides dynamic laser beam shaping methods and systems that utilize a plurality of optical elements (for example, a pair of optical elements) disposed in close proximity to one another. These optical elements may have predetermined surface shapes (either regular or freeform), diffractive characteristics, refractive characteristics, reflective characteristics, hybrid characteristics, gradient index materials, metamaterials, metasurfaces, subwavelength structures, plasmonics, etc., all suitable for modifying a wavefront. When radiation from a radiation source (i.e. laser light from a laser source) having a given energy distribution or irradiance profile is passed through this plurality of optical elements, a different energy distribution or irradiance profile results in a plane adjacent to the optical elements and may be dynamically controlled by moving the plurality of optical elements with respect to one another. For example, the plurality of optical elements may be translated laterally, rotated, tilted, separated, and/or otherwise shifted with respect to one another. This may be accomplished using mechanical or micro-electromechanical systems (MEMS) methodologies that allow for very small, rapid movements. Thus, predetermined uniform or custom output irradiance profiles may be achieved, with limitless such output irradiance profiles possible. If dynamic feedback is utilized, these output irradiance profiles can be maintained despite the presence of variable input irradiance profiles—in an inverse beam shaping application, for example. Advantageously, the dynamic laser beam shaping methods and systems of the present invention utilize optical components that enable miniaturization of said components and systems.

In one exemplary embodiment, the present invention provides a dynamic radiation beam shaping method, comprising: providing a radiation source for delivering an input radiation beam; disposing a first optical element substantially adjacent to the radiation source; disposing a second optical element substantially adjacent to the first optical element; and moving one or more of the first optical element and the second optical element relative to one another such that either an output radiation beam has a variable predetermined shape or the output radiation beam maintains a predetermined shape when the input radiation beam is varied. The radiation source is a laser source and the radiation beams are laser beams. Optionally, the first optical element and the second optical element each comprise a freeform shape. Optionally, the first optical element and the second optical element each comprise predetermined diffractive characteristics, refractive characteristics, reflective characteristics, hybrid characteristics, gradient index materials, metamaterials, metasurfaces, subwavelength structures, and/or plasmonics. The one or more of the first optical element and the second optical element are one or more of translated laterally with respect to an optic axis, rotated about the optic axis, tilted with respect to the optic axis, and separated along the optic axis. Optionally, the method also comprises moving the one or more of the first optical element and the second optical element relative to one another using a mechanical or micro-electromechanical systems (MEMS) assembly.

In another exemplary embodiment, the present invention provides a dynamic radiation beam shaping system, comprising: a radiation source for delivering an input radiation beam; a first optical element disposed substantially adjacent to the radiation source; a second optical element disposed substantially adjacent to the first optical element; and an assembly for moving one or more of the first optical element and the second optical element relative to one another such that either an output radiation beam has a variable predetermined shape or the output radiation beam maintains a predetermined shape when the input radiation beam is varied. The radiation source is a laser source and the radiation beams are laser beams. Optionally, the first optical element and the second optical element each comprise a freeform shape. Optionally, the first optical element and the second optical element each comprise predetermined diffractive characteristics, refractive characteristics, reflective characteristics, hybrid characteristics, gradient index materials, metamaterials, metasurfaces, subwavelength structures, and/or plasmonics. The one or more of the first optical element and the second optical element are one or more of translated laterally with respect to an optic axis, rotated about the optic axis, tilted with respect to the optic axis, and separated along the optic axis. Optionally, the assembly for moving the one or more of the first optical element and the second optical element relative to one another comprises a mechanical or micro-electromechanical systems (MEMS) assembly.

BRIEF DESCRIPTION OF THE DRAWINGS

The present invention is illustrated and described herein with reference to the various drawings, in which like reference numbers are used to denote like method steps/system components, as appropriate, and in which.

DETAILED DESCRIPTION OF THE INVENTION

Figure 1:
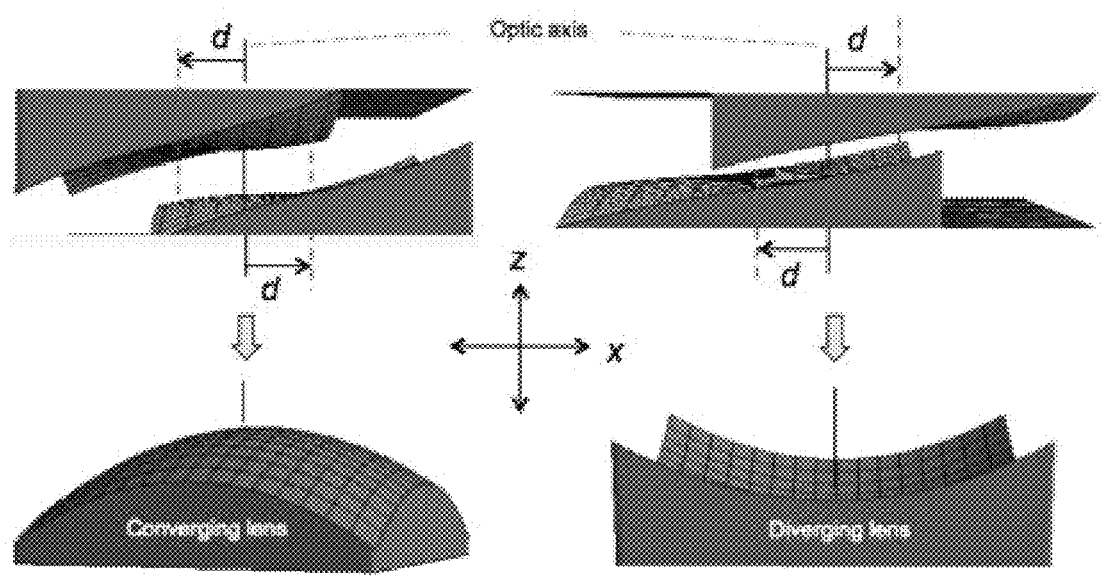
FIG. 1 is a series of schematic diagrams illustrating the operation of an Alvarez lens for dynamically varying focal length.
Figure 2:
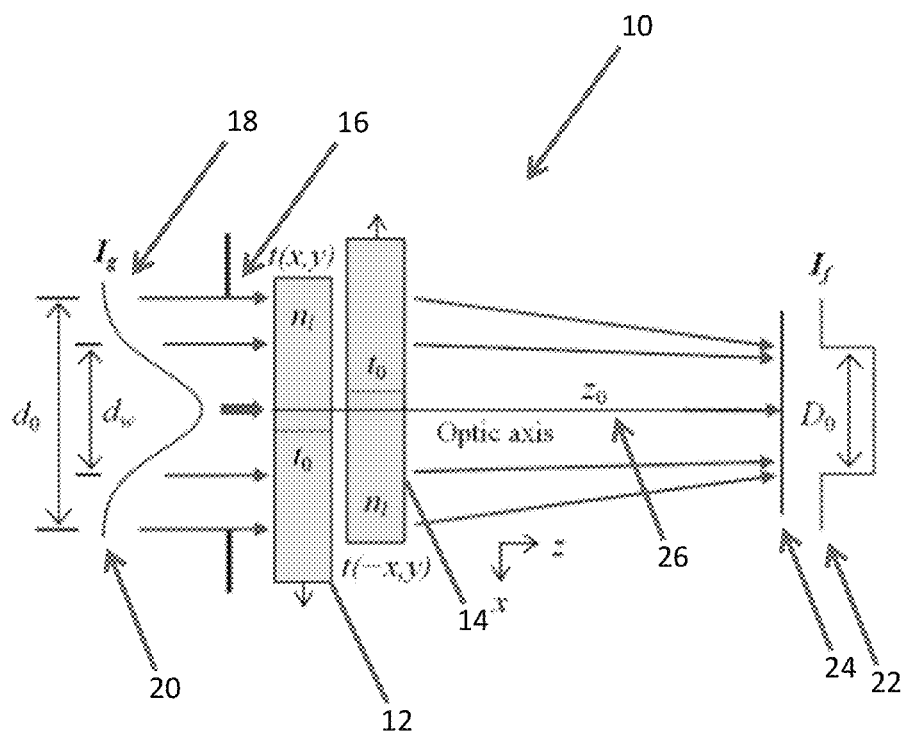
FIG. 2 is a schematic diagram illustrating one exemplary embodiment of a dynamic laser beam shaping system (and an associated method) of the present invention.

Referring now specifically to FIG. 2, in one exemplary embodiment, the dynamic laser beam shaping system 10 of the present invention includes a plurality of optical elements (for example, a pair of optical elements 12 and 14) disposed in close proximity to one another, separated by an air gap or the like that has negligible effect on the overall performance of the laser beam shaping system 10. The optical surfaces may be facing one another, for example, or they may be facing away from one another, and two or more of the four available surfaces may be optical, for example. These optical elements 12 and 14 may have predetermined surface shapes (either regular or freeform), diffractive characteristics, refractive characteristics, reflective characteristics, hybrid characteristics, gradient index materials, metamaterials, metasurfaces, subwavelength structures, plasmonics, etc., all suitable for modifying a wavefront. Preferably, these surface shapes are selected to generate a predetermined variety of output energy distributions or irradiance profiles in combination. When radiation from a radiation source (i.e. laser light 16 from a laser source 18) having a given input energy distribution or irradiance profile 20 is passed through this plurality of optical elements 12 and 14, a different output energy distribution or irradiance profile 22 results in a plane 24 adjacent to the plurality of optical elements 12 and 14 and may be dynamically controlled by moving the plurality of optical elements 12 and 14 with respect to one another. The laser source 18, plurality of optical elements 12 and 14, and plane 24 are arranged along an optic axis 26. One or both of the plurality of optical elements 12 and 14 may be translated laterally with respect to the optic axis 26 (vertically and/or horizontally), rotated about the optic axis 26, tilted with respect to the optic axis 26, separated along the optic axis 26, and/or otherwise shifted with respect to one another. This may be accomplished using mechanical or MEMS methodologies that allow for very small, rapid movements. Other methodologies are also contemplated herein. Further, the laser source 18 may be moved. Thus, predetermined uniform or custom output irradiance profiles 22 may be achieved, with limitless such output irradiance profiles 22 possible. If dynamic feedback is utilized, these output irradiance profiles 22 can be maintained despite the presence of variable input irradiance profiles 20—in an inverse beam shaping application, for example. Advantageously, the dynamic laser beam shaping methods and systems of the present invention utilize passive optical components that may easily be miniaturized. By way of example, Gaussian to flat top irradiance redistribution can be achieved using freeform optical surfaces.

It should be noted that odd numbers of optical elements may be used, or multiple pairs of optical elements, to perform dynamic beam shaping, collimation, reimaging, etc., and different materials may be used to achieve different effects, such as reimaging, rescaling, achromatization, athermalization, aberration correction, etc.

Figure 3:
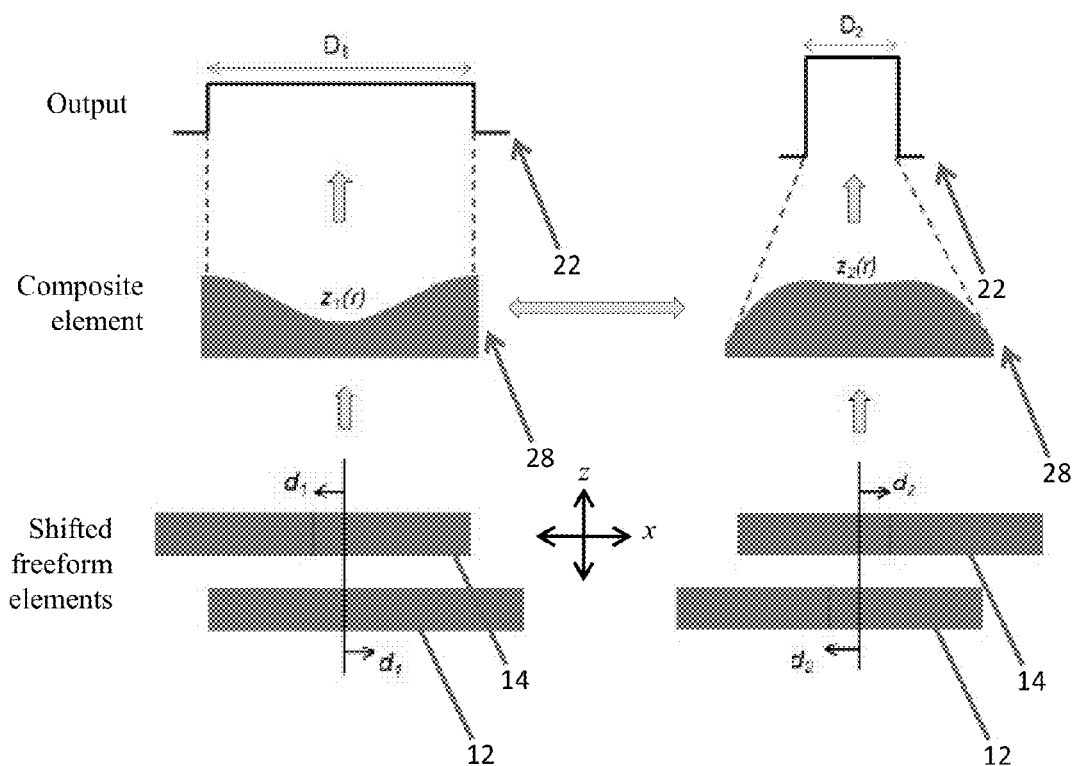
FIG. 3 is a series of schematic diagrams illustrating the dynamic variability of output energy distribution or irradiance profile achieved using the dynamic laser beam shaping methods and systems of the present invention.

Referring now specifically to FIG. 3, various shifted freeform optical elements 12 and 14 are illustrated, along with their "composite" element 28, and output energy distribution or irradiance profile 22.

Figure 4:
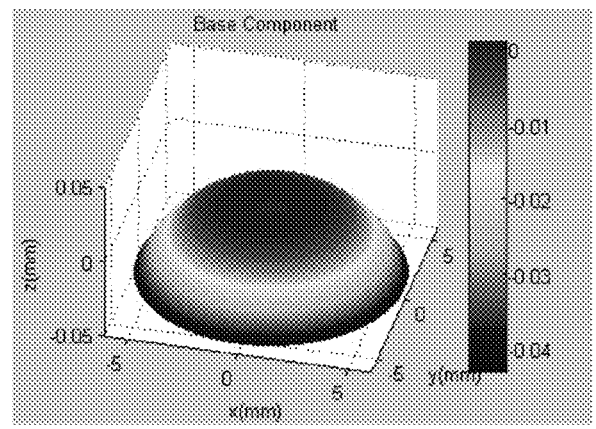
FIG. 4 is a schematic diagram illustrating optical functionality design extended by separating an optical surface into "base" and "variability" components.
Figure 4:
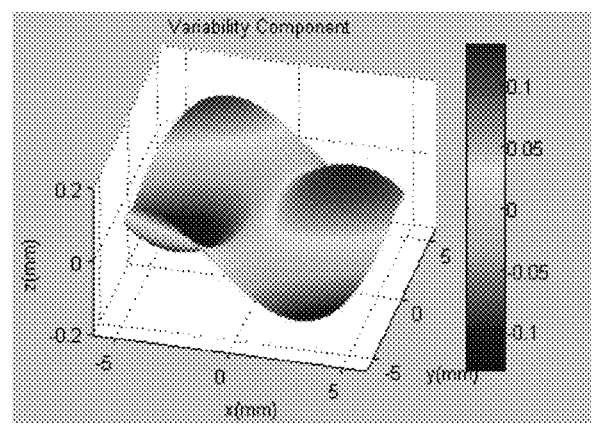
Figure 4:
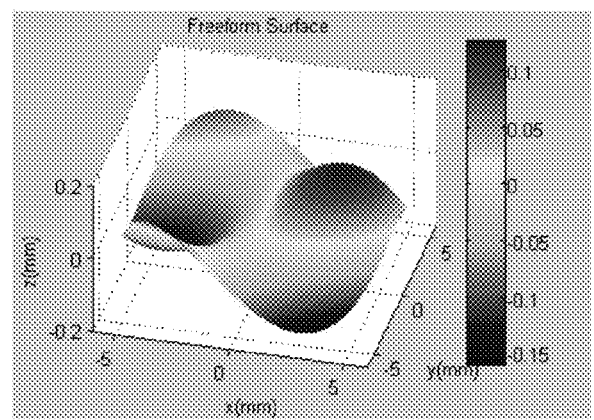

It should be noted that optical functionality may be extended by separating an optical surface into "base" and "variability" components, as is illustrated in FIG. 4. Given this methodology, several exemplary beam shaper designs are provided herein below. In general, the "base" function determines the function of the system at zero relative displacement between the optical elements, for example, and the "variability" function determines how the function of the system changes as the optical elements are moved relative to one another.

First, consider the design of a variable radial beamshaper. The following design parameters are selected:
Wavelength—632.8 nm
Input Waist Diameter—6 mm
Material/Index—PMMA/1.49
Target Distance—150 mm
Output Diameter—3 mm-7 mm 291 μm depth across 12 mm aperture
Output diameter=5 mm at d=0
Lateral shift of Δd=150 μm causes 1 mm change in output diameter
The optical surface coefficients ($c_0$=0.0556) are:
Order (k), $a_{2k}$ Values (mm$^{-2k+1}$), $b_{2k}$ values (mm$^{-2k}$)
1 1.2153E-03, -5.3454E-03
2 -2.2248E-04, 1.4828E-04
3 6.8131E-06, -4.5348E-06
4 -1.6435E-07, 1.0930E-07
5 2.8309E-09, -1.8807E-09
6 -3.0573E-11, 2.0289E-11
7 1.5346E-13, -1.0173E-13
The governing equations for this example are:

$$z_F(x,y) = \sum_{k=1}^{n} \frac{1}{2} a_{2k}(x^2+y^2)^k + \sum_{k=1}^{n} b_{2k} \int (x^2+y^2)^k dx + c_0 x$$

$$b_{2k} = \frac{\Delta a_{2k}}{2\Delta d},$$

where $z_f$ represents the surface height distribution of the surface of an optical element.

Figure 5:
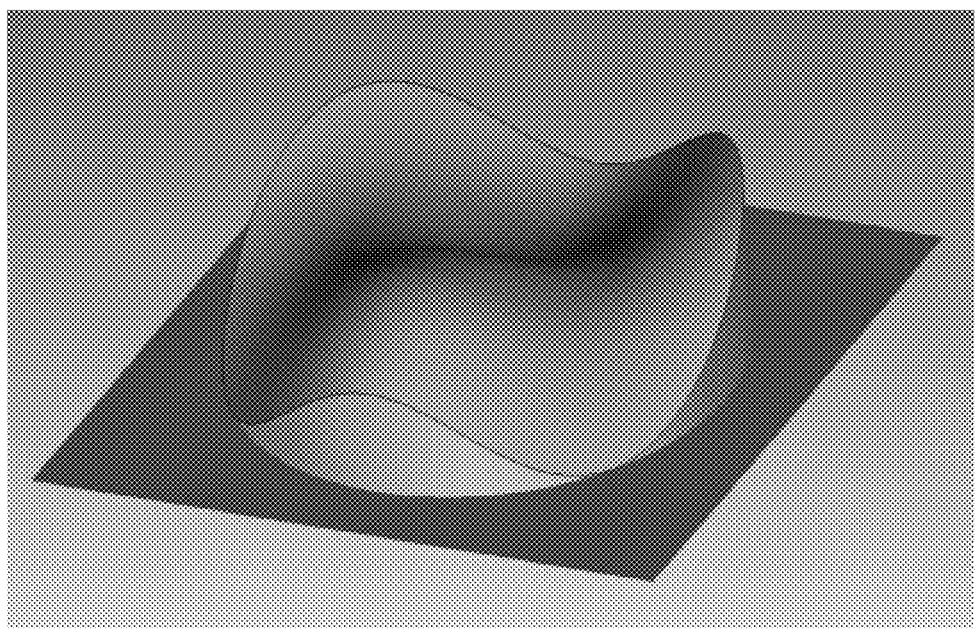
FIG. 5 is a schematic diagram illustrating an exemplary optical surface used in a simulation of a variable radial beamshaper in accordance with the methods and systems of the present invention.
Figure 6:
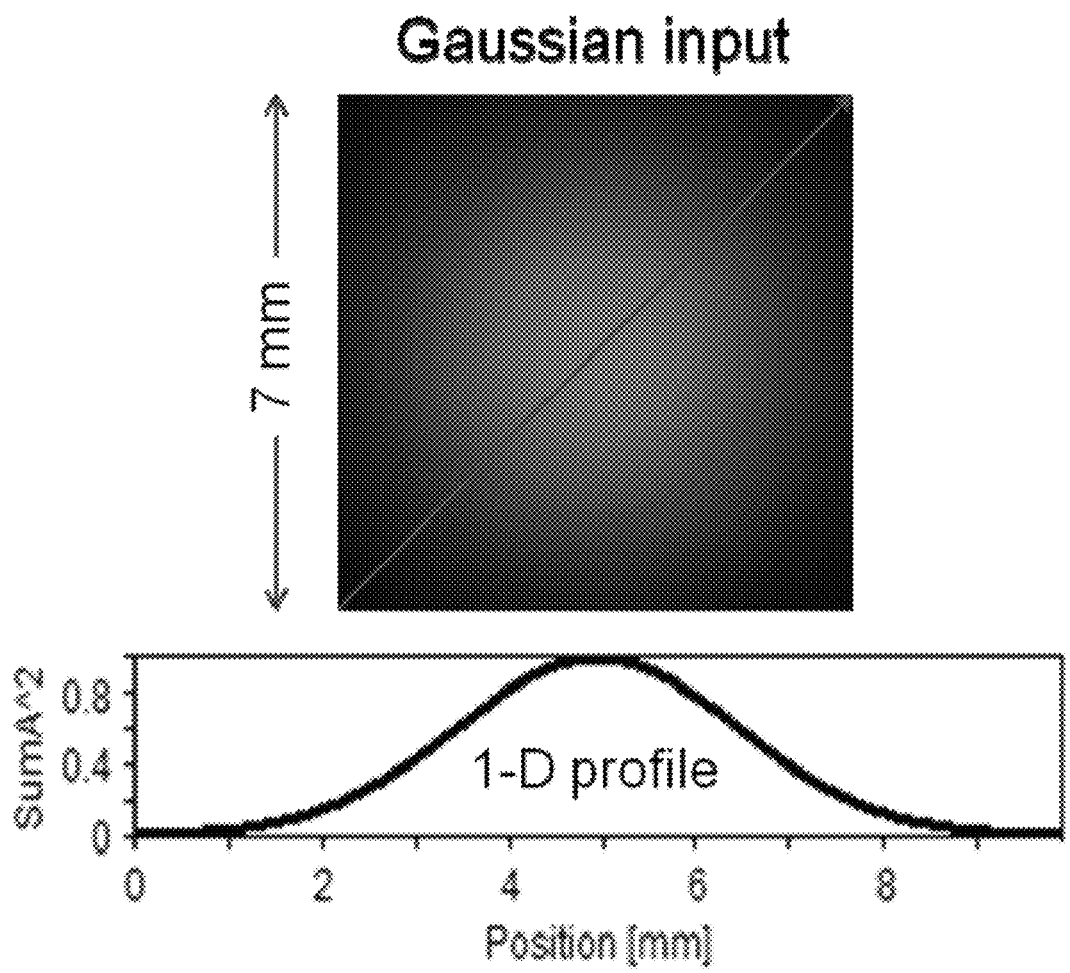
FIG. 6 is a schematic diagram illustrating an exemplary input irradiance profile used in a simulation of a variable radial beamshaper in accordance with the methods and systems of the present invention.
Figure 7:
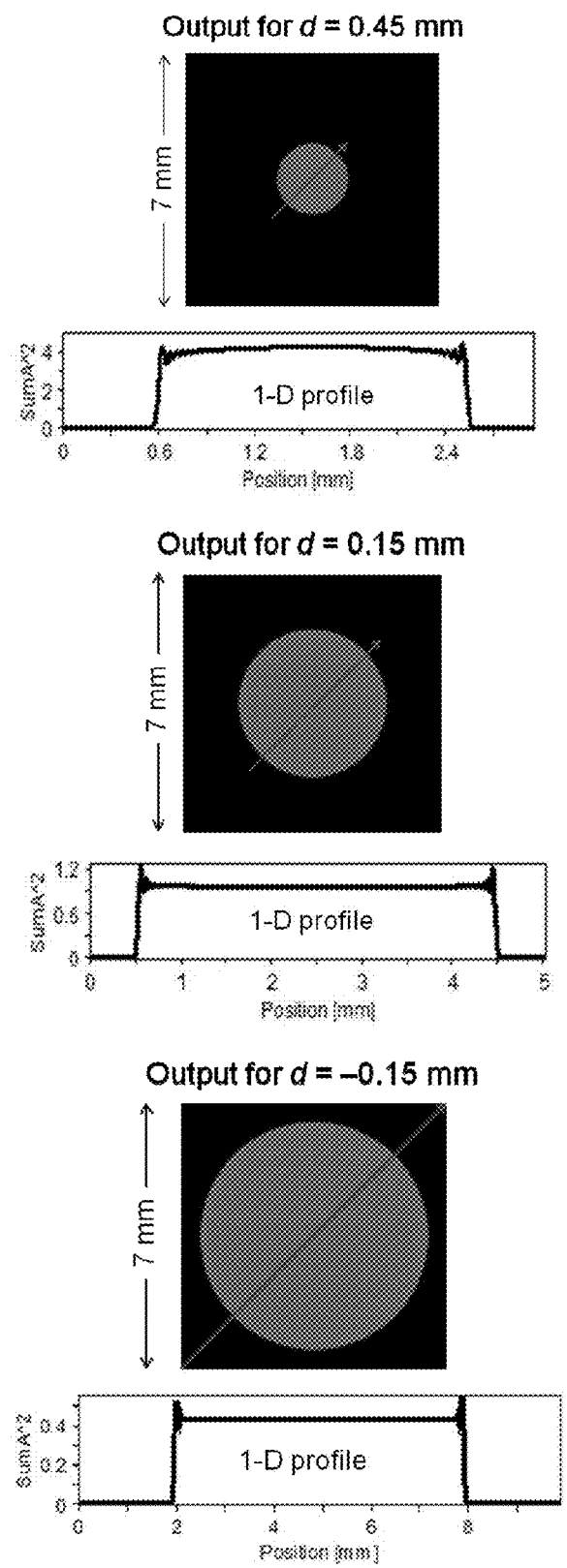
FIG. 7 is a series of schematic diagrams illustrating exemplary output irradiance profiles derived using a simulation of a variable radial beamshaper in accordance with the methods and systems of the present invention.

In simulation, two optical elements with a 200 μm standoff between optical surfaces were explored using Zemax and VirtualLab. This simulation confirmed beam redistribution and scaling. The results are provided in FIGS. 5-7.

Figure 8:
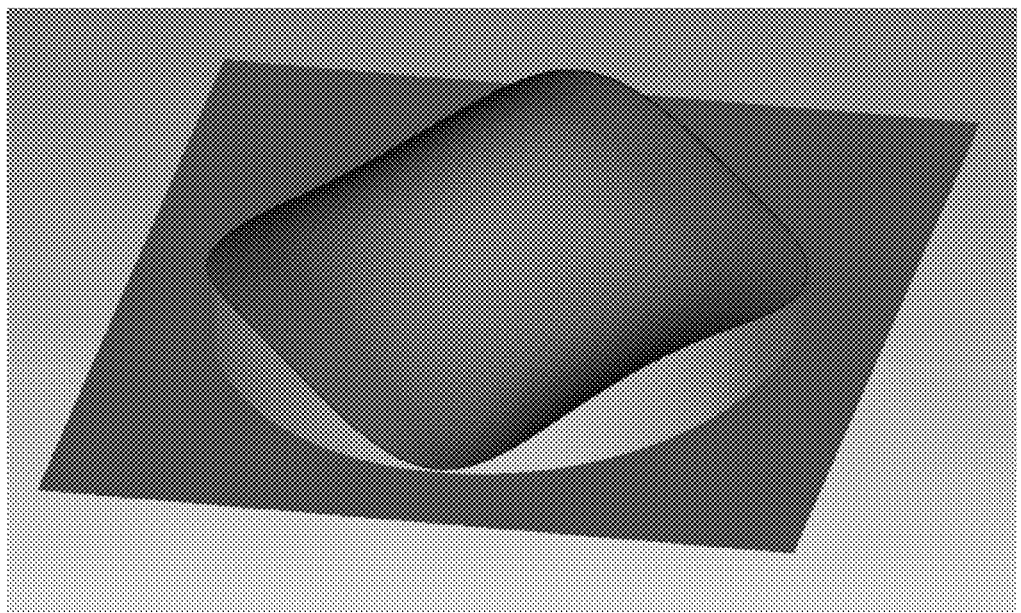
FIG. 8 is a schematic diagram illustrating an exemplary optical surface used in a simulation of a variable square beamshaper in accordance with the methods and systems of the present invention.
Figure 9:
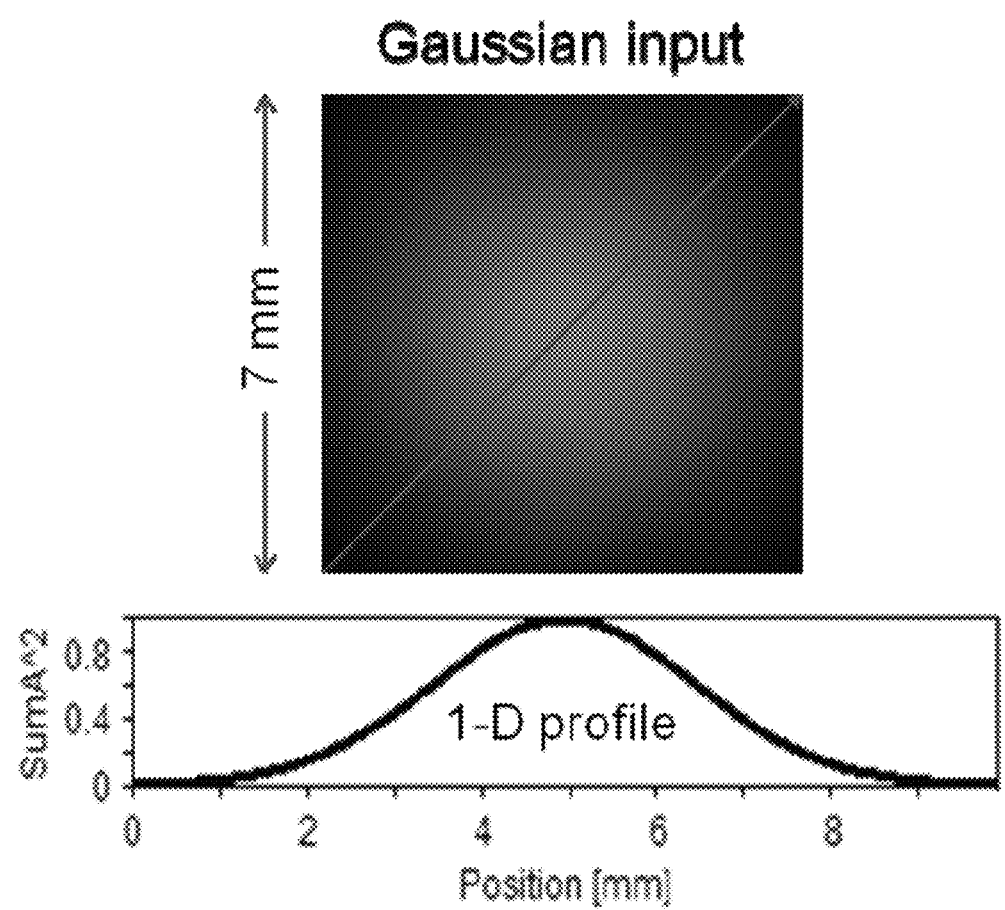
FIG. 9 is a schematic diagram illustrating an exemplary input irradiance profile used in a simulation of a variable square beamshaper in accordance with the methods and systems of the present invention.
Figure 10:
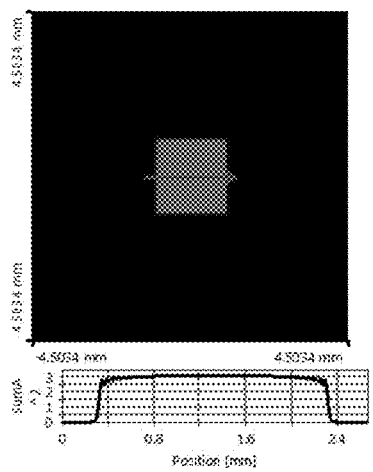
FIG. 10 is a series of schematic diagrams illustrating exemplary output irradiance profiles derived using a simulation of a variable square beamshaper in accordance with the methods and systems of the present invention.
Figure 10:
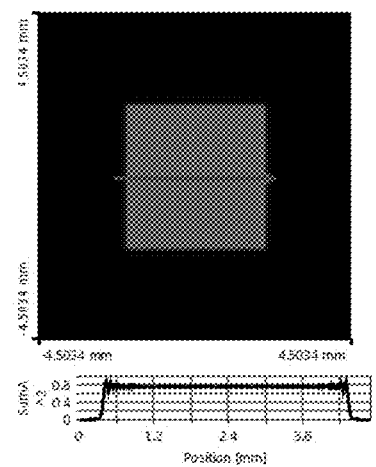
Figure 10:
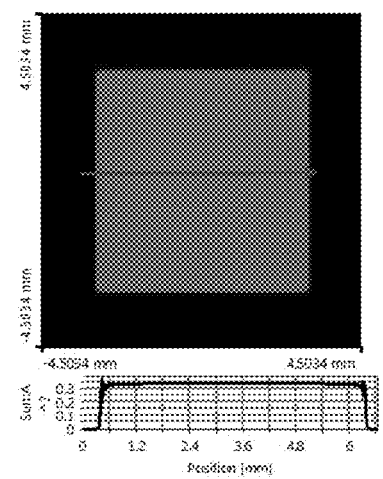

Likewise, in the simulation of a variable square beamshaper, two optical elements with a 200 μm standoff between optical surfaces were explored using Zemax and VirtualLab. This simulation confirmed beam redistribution and scaling. The results are provided in FIGS. 8-10.

Figure 11:
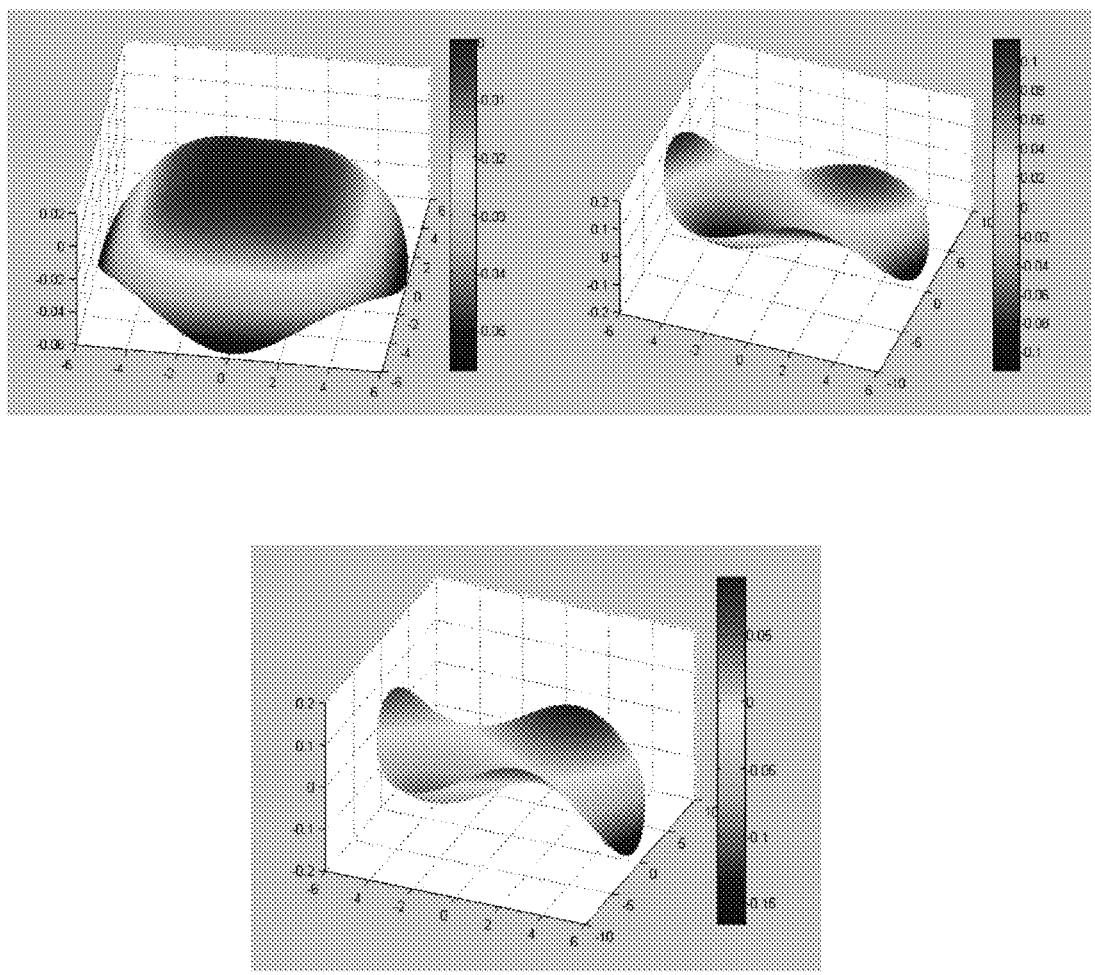
FIG. 11 is a series of schematic diagrams illustrating the base component, variability component, and combined base and variability optical surface for a rectangular variable output beamshaper in accordance with the methods and systems of the present invention.
Figure 12:
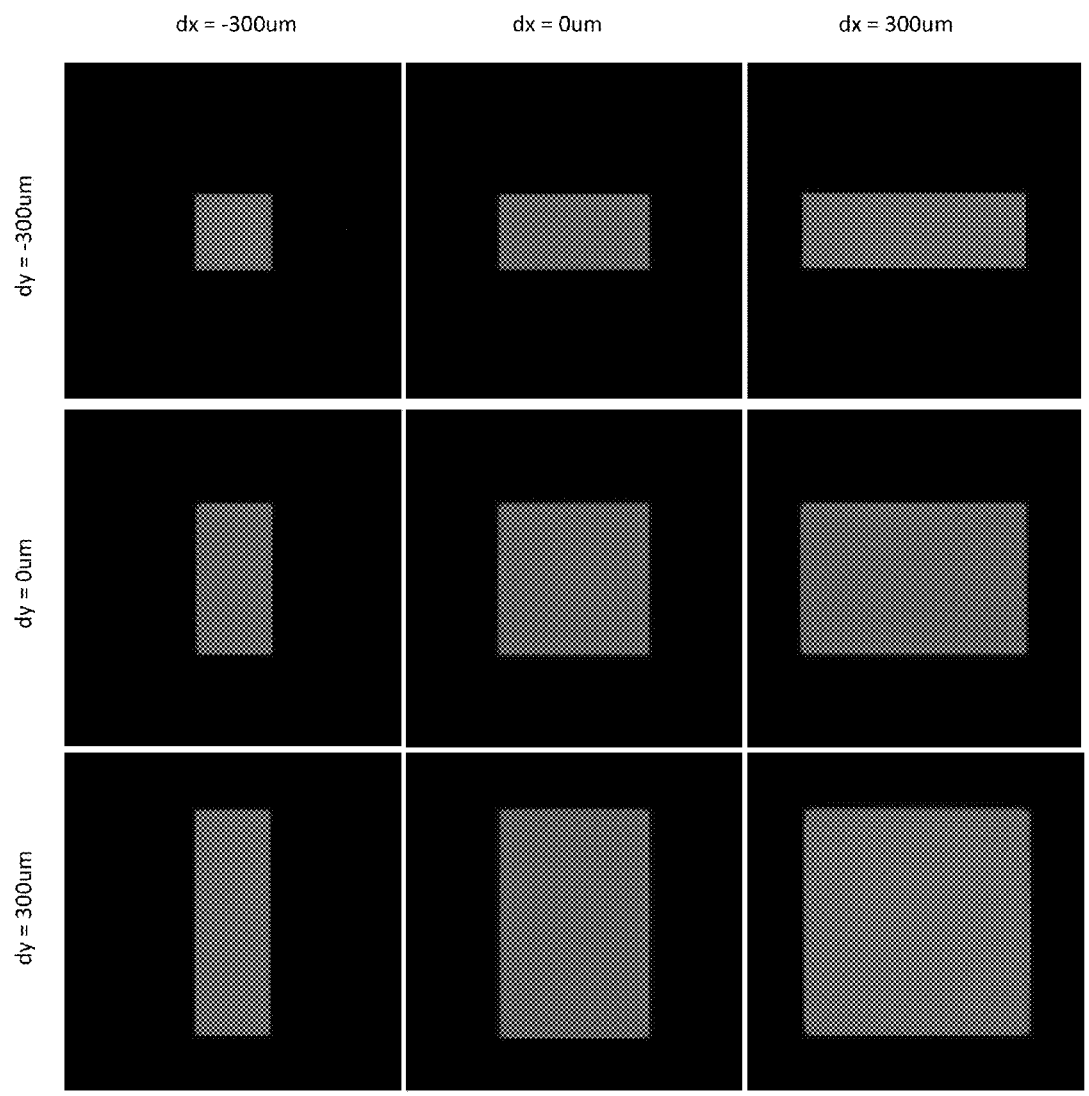
FIG. 12 is a series of schematic diagrams illustrating exemplary output irradiance profiles derived using a simulation of a variable rectangular beamshaper in accordance with the methods and systems of the present invention.

FIG. 11 is a series of plots illustrating the base component, variability component, and combined base and variability optical surface for a square variable output beamshaper optical surface in accordance with the methods and systems of the present invention, and FIG. 12 is a series of plots illustrating exemplary output irradiance profiles derived using a simulation of this variable square beamshaper in accordance with the methods and systems of the present invention. In this case, only the output size varied in the y direction when laterally shifted in the y direction and only the output size varied in the x direction when laterally shifted in the x direction, while maintaining a uniform irradiance distribution in the shape of a rectangle. The governing equations for this example are as follows:

$$b_{2kx} = \frac{\Delta a_{2kx}}{2\Delta d_x}, b_{2ky} = \frac{\Delta a_{2ky}}{2\Delta d_y}$$

$$z_f(x,y) = \sum_k^n \left(\frac{1}{2}a_{2kx}x^{2k} + \frac{1}{2}a_{2ky}y^{2k}\right) + \sum_k^n \left(\int b_{2kx} x^{2k} dx + \int b_{2ky} y^{2k} dy\right)$$

The parameters are as follows:
Input waist diameter: 6 mm
Wavelength: 632.8 nm
Material: PMMA (n=1.49)
Focal length: 150 mm
Lens diameter: 12 mm
Central output dimensions: 4×4 mm square
Output dimension range: 2×2 mm-6×6 mm, with x and y dimensions independently variable
Shift increment: 150 μm (150 μm shift results in a 1 mm change in output dimension)

Figure 13:
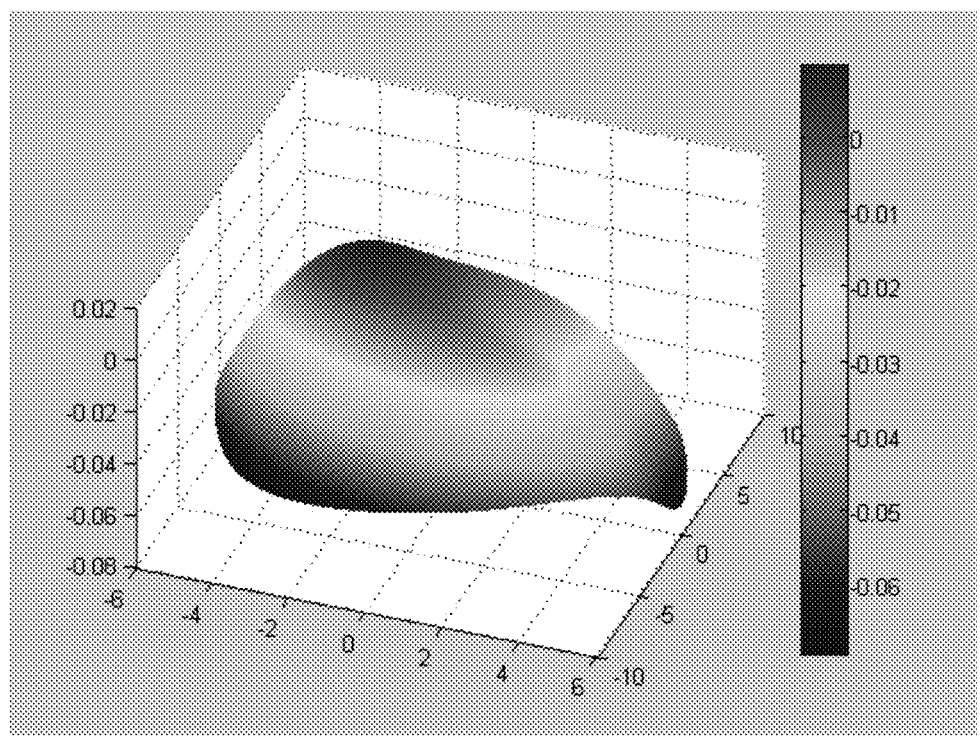
FIG. 13 is a schematic diagram illustrating the combined base and variability optical surface for a super Gaussian inverse variable output beamshaper in accordance with the methods and systems of the present invention.
Figure 14:
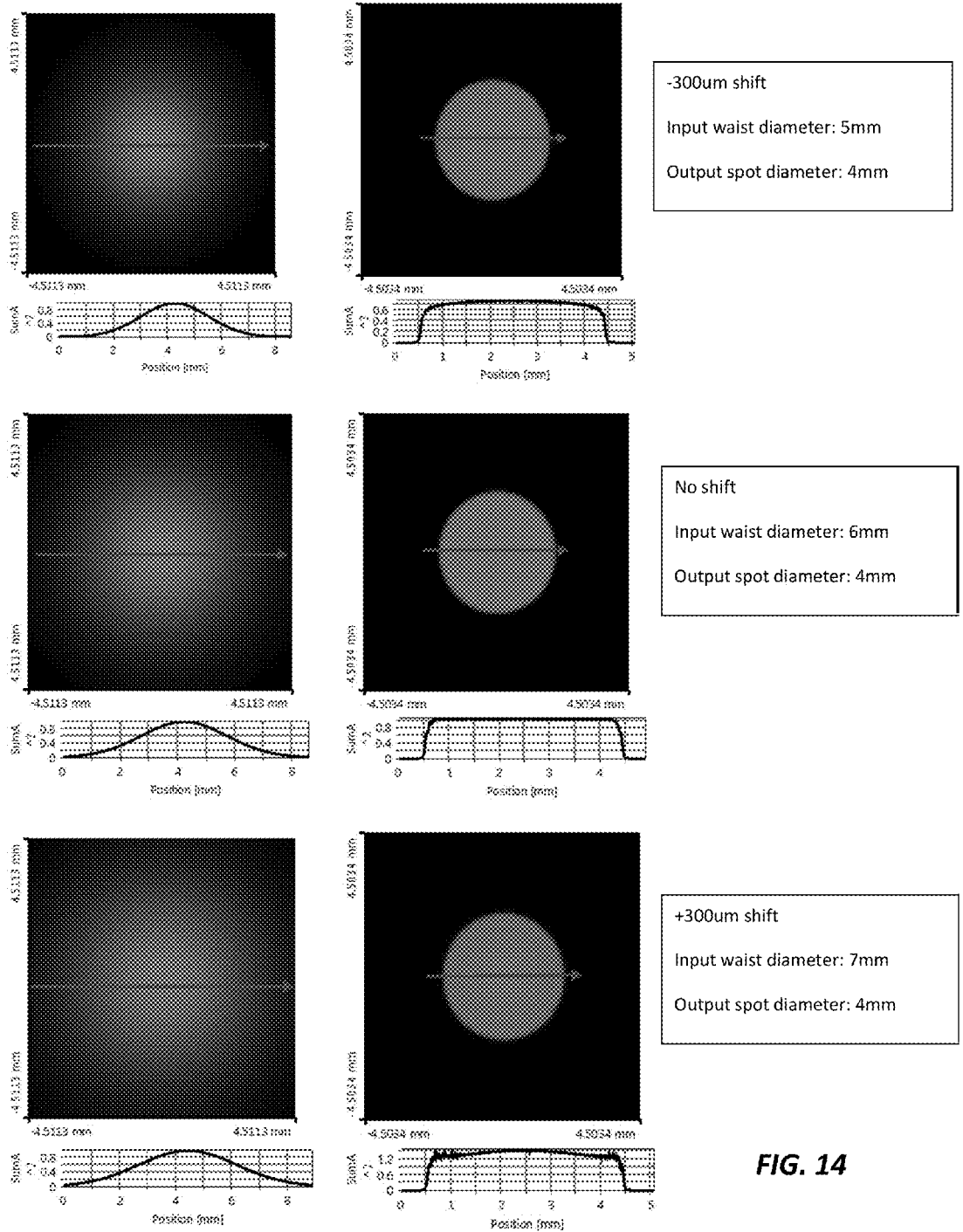
FIG. 14 is a series of schematic diagrams illustrating exemplary input and output irradiance profiles derived using a simulation of a variable super Gaussian inverse beamshaper in accordance with the methods and systems of the present invention.

FIG. 13 is a schematic diagram illustrating the combined base and variability optical surface for a super Gaussian inverse variable output beamshaper in accordance with the methods and systems of the present invention; and FIG. 14 is a series of schematic diagrams illustrating exemplary input and output irradiance profiles derived using a simulation of a variable super Gaussian inverse beamshaper in accordance with the methods and systems of the present invention. The governing equations for this example are:

$$z_F(x,y) = \sum_{k=1}^{n} \frac{1}{2} a_{2k}(x^2+y^2)^k + \sum_{k=1}^{n} b_{2k} \int (x^2+y^2)^k dx + c_0 x$$

$$b_{2k} = \frac{\Delta a_{2k}}{2\Delta d}.$$

The parameters and results are as follows:
Super Gaussian parameter: p=40
Material: PMMA (n=1.490)
Wavelength: 632.8 nm
Lens diameter: 12 mm
Output diameter: 4 mm
Input diameter range: 5-7 mm
Shift increment: 0.15 mm (0.15 mm shift results in a 0.5 mm change in input diameter)
Target location: 150 mm
Results: (sag=79 μm, $c_0$=-0.0079)

| Order (k) | $a_{2k}$ Values (mm$^{-2k+1}$) | $b_{2k}$ values (mm$^{-2k}$) |
| --- | --- | --- |
| 1 | -6.12474E-04 | 1.76551E-03 |
| 2 | -1.65321E-04 | -1.56952E-04 |
| 3 | 4.167688E-06 | 8.56713E-06 |
| 4 | -3.90091E-08 | -2.81331E-07 |
| 5 | -1.17842E-9 | 5.20387E-09 |
| 6 | 3.87589E-11 | -4.66841E-11 |
| 7 | -3.35565E-13 | 1.28211E-13 |

The dynamic laser beam shaping methods and systems of the present invention find applicability in a broad range of fields. For example, they are ideally suited for biomedical applications, such as laser surgery, tissue ablation, tissue welding, and dermatological procedures; laser material processing, such as welding and cutting, ablation, and shock processing; and additive manufacturing, such as the curing of polymers and the sintering of polymers and metals.

The dynamic laser beam shaping methods and systems of the present invention have several distinct advantages over competing methods and systems. First, existing beamshaping methodologies typically require the design and fabrication of a new component for each new output, while the present beamshaping methodology enables a dynamically tunable range of outputs using only two elements. Second, existing variable beamshaping methodologies require the combination of a fixed beamshaping element with a multi-lens imaging system, while the present beamshaping methodology is much more compact, requires fewer components, and has fewer optical surfaces, thus it is lower cost and reduces reflective losses. Third, dynamic tunability enables adaptive change during use.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A dynamic radiation beam shaping method, comprising:
providing a radiation source for delivering an input radiation beam;
disposing a first optical element substantially adjacent to the radiation source;
disposing a second optical element substantially adjacent to the first optical element such that a radiation beam from the radiation source experiences wavefront shape modification in terms of one or more of energy distribution and irradiance profile from a combination of the first optical element and the second optical element; and
moving one or more of the first optical element and the second optical element relative to one another such that either an output radiation beam has a variable predetermined shape or the output radiation beam maintains a predetermined shape when the input radiation beam is varied;
wherein the first optical element and the second optical element each comprise a freeform shape that the radiation beam passes through in sequence.

2. The dynamic radiation beam shaping method of claim 1, wherein the radiation source is a laser source and the radiation beams are laser beams.

3. The dynamic radiation beam shaping method of claim 1, wherein the first optical element and the second optical element each comprise one or more predetermined diffractive characteristics, refractive characteristics, reflective characteristics, hybrid characteristics, gradient index materials, metamaterials, metasurfaces, subwavelength structures, and/or plasmonics.

4. The dynamic radiation beam shaping method of claim 1, wherein the one or more of the first optical element and the second optical element are one or more of translated laterally with respect to an optic axis, rotated about the optic axis, tilted with respect to the optic axis, and separated along the optic axis.

5. The dynamic radiation beam shaping method of claim 1, further comprising moving the one or more of the first optical element and the second optical element relative to one another using a mechanical or micro-electromechanical systems (MEMS) assembly.

6. A dynamic radiation beam shaping system, comprising:
a radiation source for delivering an input radiation beam;
a first optical element disposed substantially adjacent to the radiation source;
a second optical element disposed substantially adjacent to the first optical element such that a radiation beam from the radiation source experiences wavefront shape modification in terms of one or more of energy distribution and irradiance profile from a combination of the first optical element and the second optical element; and
an assembly for moving one or more of the first optical element and the second optical element relative to one another such that either an output radiation beam has a variable predetermined shape or the output radiation beam maintains a predetermined shape when the input radiation beam is varied;
wherein the first optical element and the second optical element each comprise a freeform shape that the radiation beam passes through in sequence.

7. The dynamic radiation beam shaping system of claim 6, wherein the radiation source is a laser source and the radiation beams are laser beams.

8. The dynamic radiation beam shaping system of claim 6, wherein the first optical element and the second optical element each comprise one or more predetermined diffractive characteristics, refractive characteristics, reflective characteristics, hybrid characteristics, gradient index materials, metamaterials, metasurfaces, subwavelength structures, and/or plasmonics.

9. The dynamic radiation beam shaping system of claim 6, wherein the one or more of the first optical element and the second optical element are one or more of translated laterally with respect to an optic axis, rotated about the optic axis, tilted with respect to the optic axis, and separated along the optic axis.

10. The dynamic radiation beam shaping system of claim 6, wherein the assembly for moving the one or more of the first optical element and the second optical element relative to one another comprises a mechanical or micro-electromechanical systems (MEMS) assembly.

* * * * *